(12) United States Patent
Kho et al.

(10) Patent No.: US 11,306,393 B2
(45) Date of Patent: Apr. 19, 2022

(54) METHODS AND APPARATUS FOR ALD PROCESSES

(71) Applicant: Applied Materials, Inc., Santa Clara, CA (US)

(72) Inventors: Jeffrey A. Kho, Union City, CA (US); Chien-Teh Kao, Sunnyvale, CA (US); Jianhua Zhou, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 236 days.

(21) Appl. No.: 16/517,255

(22) Filed: Jul. 19, 2019

(65) Prior Publication Data

US 2020/0040455 A1 Feb. 6, 2020

Related U.S. Application Data

(60) Provisional application No. 62/712,793, filed on Jul. 31, 2018.

(51) Int. Cl.
| | | |
|---|---|---|
| *C23C 16/455* | (2006.01) | |
| *H01L 51/56* | (2006.01) | |
| *C23C 16/52* | (2006.01) | |

(52) U.S. Cl.
CPC .. *C23C 16/45544* (2013.01); *C23C 16/45536* (2013.01); *C23C 16/45553* (2013.01); *C23C 16/45565* (2013.01); *C23C 16/45574* (2013.01); *C23C 16/52* (2013.01); *H01L 51/56* (2013.01)

(58) Field of Classification Search
CPC ........ C23C 16/45544; C23C 16/45536; C23C 16/52; C23C 16/45553; C23C 16/45565; C23C 16/042; C23C 16/45502; C23C 16/54; C23C 16/45574; H01L 51/56; H01L 51/5256

See application file for complete search history.

(56) References Cited

U.S. PATENT DOCUMENTS

| | | | | |
|---|---|---|---|---|
| 4,590,042 A | * | 5/1986 | Drage | H01J 37/3244 |
| | | | | 156/345.34 |
| 4,993,358 A | * | 2/1991 | Mahawili | C23C 16/4412 |
| | | | | 118/715 |
| 5,595,606 A | * | 1/1997 | Fujikawa | C23C 16/45561 |
| | | | | 118/725 |
| 6,086,677 A | * | 7/2000 | Umotoy | C23C 16/45514 |
| | | | | 118/715 |

(Continued)

FOREIGN PATENT DOCUMENTS

| | | |
|---|---|---|
| KR | 20110139079 A | 12/2011 |
| KR | 20130085962 A | 7/2013 |

OTHER PUBLICATIONS

International Search Report and Written Opinion for Application No. PCT/US2019/042457 dated Nov. 11, 2019.

*Primary Examiner* — Jeffrie R Lund (74) *Attorney, Agent, or Firm* — Patterson + Sheridan LLP (57) ABSTRACT

The present disclosure relates to methods and apparatus for an atomic layer deposition (ALD) chamber. In one embodiment, a lid assembly is provided that includes a multi-channel showerhead having a plurality of first gas channels and a plurality of second gas channels that are fluidly isolated from each of the first gas channels, and a flow guide coupled to opposing sides of the multi-channel showerhead, each of the flow guides being fluidly coupled to the plurality of second gas channels.

19 Claims, 9 Drawing Sheets

(56) References Cited

U.S. PATENT DOCUMENTS

| | | | | |
|---|---|---|---|---|
| 6,161,500 A * | 12/2000 | Kopacz | ............ | C23C 16/45514 118/723 E |
| 6,182,603 B1 * | 2/2001 | Shang | ................ | C23C 16/4404 118/723 ME |
| 6,530,994 B1 * | 3/2003 | Mahawili | ............ | C23C 16/4584 118/725 |
| 6,806,211 B2 * | 10/2004 | Shinriki | .................. | C23C 16/40 118/715 |
| 7,641,762 B2 * | 1/2010 | Keller | ................ | H01J 37/3244 156/345.34 |
| 8,303,713 B2 * | 11/2012 | Belousov | ............ | C23C 16/4584 118/715 |
| 8,955,547 B2 * | 2/2015 | Gungor | ..................... | F17C 1/00 137/597 |
| 10,755,900 B2 * | 8/2020 | Tran | ................... | C23C 16/0254 |
| 10,961,621 B2 * | 3/2021 | Sivaramakrishnan | ........................ | C23C 16/4412 |
| 11,186,910 B2 * | 11/2021 | Mustafa | ............ | C23C 16/45565 |
| 2001/0027026 A1 * | 10/2001 | Dhindsa | ............ | C23C 16/45572 438/712 |
| 2001/0042799 A1 | 11/2001 | Kim et al. | | |
| 2005/0092249 A1 | 5/2005 | Kilpela et al. | | |
| 2005/0183827 A1 * | 8/2005 | White | ................ | H01J 37/3244 156/345.34 |
| 2006/0021703 A1 * | 2/2006 | Umotoy | ............ | H01J 37/3244 156/345.34 |
| 2008/0099145 A1 * | 5/2008 | Keller | ................ | C23C 16/45565 156/345.34 |
| 2010/0037823 A1 * | 2/2010 | Cho | ...................... | C23C 16/042 118/723 R |
| 2012/0097330 A1 | 4/2012 | Iyengar et al. | | |
| 2013/0098477 A1 * | 4/2013 | Yudovsky | ......... | C23C 16/45536 137/507 |
| 2015/0176126 A1 * | 6/2015 | Ge | .................... | C23C 16/45574 137/240 |
| 2017/0283947 A1 * | 10/2017 | Rasheed | ................ | C23C 16/509 |
| 2017/0283985 A1 * | 10/2017 | Takahashi | ............. | C23C 16/455 |
| 2020/0040455 A1 * | 2/2020 | Kho | ........................ | C23C 16/52 |
| 2020/0087789 A1 * | 3/2020 | Mustafa | ............ | C23C 16/45565 |
| 2020/0291522 A1 * | 9/2020 | Panavalappil Kumarankutty | ........ | C23C 16/45574 |
| 2021/0187521 A1 * | 6/2021 | Mustafa | ............ | C23C 16/45553 |

\* cited by examiner

METHODS AND APPARATUS FOR ALD PROCESSES

CROSS-REFERENCE TO RELATED APPLICATION

This application claims benefit of U.S. Provisional Patent Application Ser. No. 62/712,793, filed Jul. 31, 2018, which is incorporated by reference herein.

BACKGROUND

Field

Embodiments of the present disclosure generally relate to methods and apparatus for processing large area substrates. More particularly, embodiments of the present disclosure relate to a chamber for forming electronic devices on large area substrates.

Description of the Related Art

Organic light emitting diodes (OLED) are used in the manufacture of television screens, computer monitors, mobile phones, other hand-held devices, etc. for displaying information. A typical OLED may include layers of organic material situated between two electrodes that are all deposited on a substrate in a manner to form a matrix display panel having pixels that may be individually energized. The OLED is generally placed between two glass panels, and the edges of the glass panels are sealed to encapsulate the OLED therein.

The OLED industry, as well as other industries that utilize substrate processing techniques, must encapsulate moisture-sensitive devices to protect them from ambient moisture exposure. A thin conformal layer of material has been proposed as a means of reducing water vapor transmission rate (WVTR) through encapsulation layer(s). Currently, there are a number of ways this is being done commercially. Using an atomic layer deposition (ALD) process to cover a moisture-sensitive device is being considered to determine if the conformal nature of these coatings can provide a more effective moisture barrier than other coatings.

ALD is based upon atomic layer epitaxy (ALE) and employs chemisorption techniques to deliver precursor molecules on a substrate surface in sequential cycles. The cycle exposes the substrate surface to a first precursor and then to a second precursor. Optionally, a purge gas may be introduced between introductions of the precursors. The first and second precursors react to form a product compound as a film on the substrate surface. The cycle is repeated to form the layer to a desired thickness.

One method of performing ALD is by time-separated (TS) pulses of precursor gases along a single flow path. This method has several advantages over other methods. However one drawback of TS-ALD is that the deposited film tends to be thicker on one side of the substrate as opposed to the other side.

There is a need, therefore, for improving film thickness uniformity across a surface of a substrate.

SUMMARY

The present disclosure relates to methods and apparatus for a thin film encapsulation (TFE) on a device such as an OLED. The present disclosure also relates to methods and apparatus for an atomic layer deposition (ALD) chamber. Embodiments of the method include a bi-directional flow of precursor gases across a large area substrate.

In one embodiment, a lid assembly is provided that includes a multi-channel showerhead having a plurality of first gas channels and a plurality of second gas channels that are fluidly isolated from each of the first gas channels, and a flow guide coupled to opposing sides of the multi-channel showerhead, each of the flow guides being fluidly coupled to the plurality of second gas channels.

In one embodiment, a lid assembly for use in an atomic layer deposition (ALD) chamber is disclosed. The lid assembly includes a multi-channel showerhead, a dielectric skirt surrounding the multi-channel showerhead, and a flow guide coupled to opposing sides of the multi-channel showerhead, wherein the multi-channel showerhead includes a plurality of first gas channels and a plurality of second gas channels that are fluidly isolated from each of the first gas channels, and each of the flow guides are fluidly coupled to the plurality of second gas channels.

In another embodiment, a lid assembly for use in an atomic layer deposition (ALD) chamber is provided. The lid assembly includes a multi-channel showerhead, a dielectric skirt surrounding the multi-channel showerhead, and a flow guide coupled to opposing sides of the multi-channel showerhead, each of the flow guides including a manifold having a slot formed therein, wherein the multi-channel showerhead includes a plurality of first gas channels and a plurality of second gas channels that are fluidly isolated from each of the first gas channels, and each of the manifolds are fluidly coupled to the plurality of second gas channels.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure include a processing system that is operable to deposit a plurality of layers on a substrate, the plurality of layers capable of acting as an encapsulation layer on an OLED layer formed on the substrate. The system includes a plurality of processing chambers, with each processing chamber operable to deposit one or more of the plurality of layers. The processing system further includes at least one transfer chamber and at least one load lock chamber. The at least one transfer chamber enables transfer of substrates between the plurality of processing chambers without breaking vacuum in the processing system. The at least one load lock chamber enables loading and removal of substrates from the processing system without breaking vacuum in the processing system. The processing system further includes a mask chamber that enables loading and removal of masks used in the processing chambers without breaking vacuum in the processing system.

Embodiments of the disclosure include an atomic layer deposition (ALD) processing chamber that is operable to align a mask with respect to a substrate, position the mask on the substrate, and perform ALD to deposit an encapsulation layer on an OLED formed on the substrate. The ALD process performed in the ALD processing chamber may be time-separated ALD (TS-ALD), but the embodiments described herein may be used with other types of processing chambers and are not limited to use with TS-ALD processing chambers. The encapsulation layers deposited by the ALD processing chambers may comprise silicon nitride (SiN), but the embodiments described herein may be used with other types of processing chambers and are not limited to use with SiN CVD processing chambers.

The embodiments described herein may be used with other types of deposition processes and are not limited to use for encapsulating OLEDs formed on substrates. The embodiments described herein may be used with various types, shapes, and sizes of masks and substrates.

A substrate as used herein is a flexible, large area substrate, such as a substrate having a surface area of about 1 square meter, or greater. However, the substrate is not limited to any particular size or shape. In one aspect, the term "substrate" refers to any polygonal, squared, rectangular, curved or otherwise non-circular workpiece, such as a glass or polymer substrate used in the fabrication of flat panel displays, for example.

In the description that follows, the terms "gas" and "gases" are used interchangeably, unless otherwise noted, and refer to one or more precursors, reactants, catalysts, carrier gases, purge gases, cleaning gases, effluent, combinations thereof, as well as any other fluid.

Figure 1:
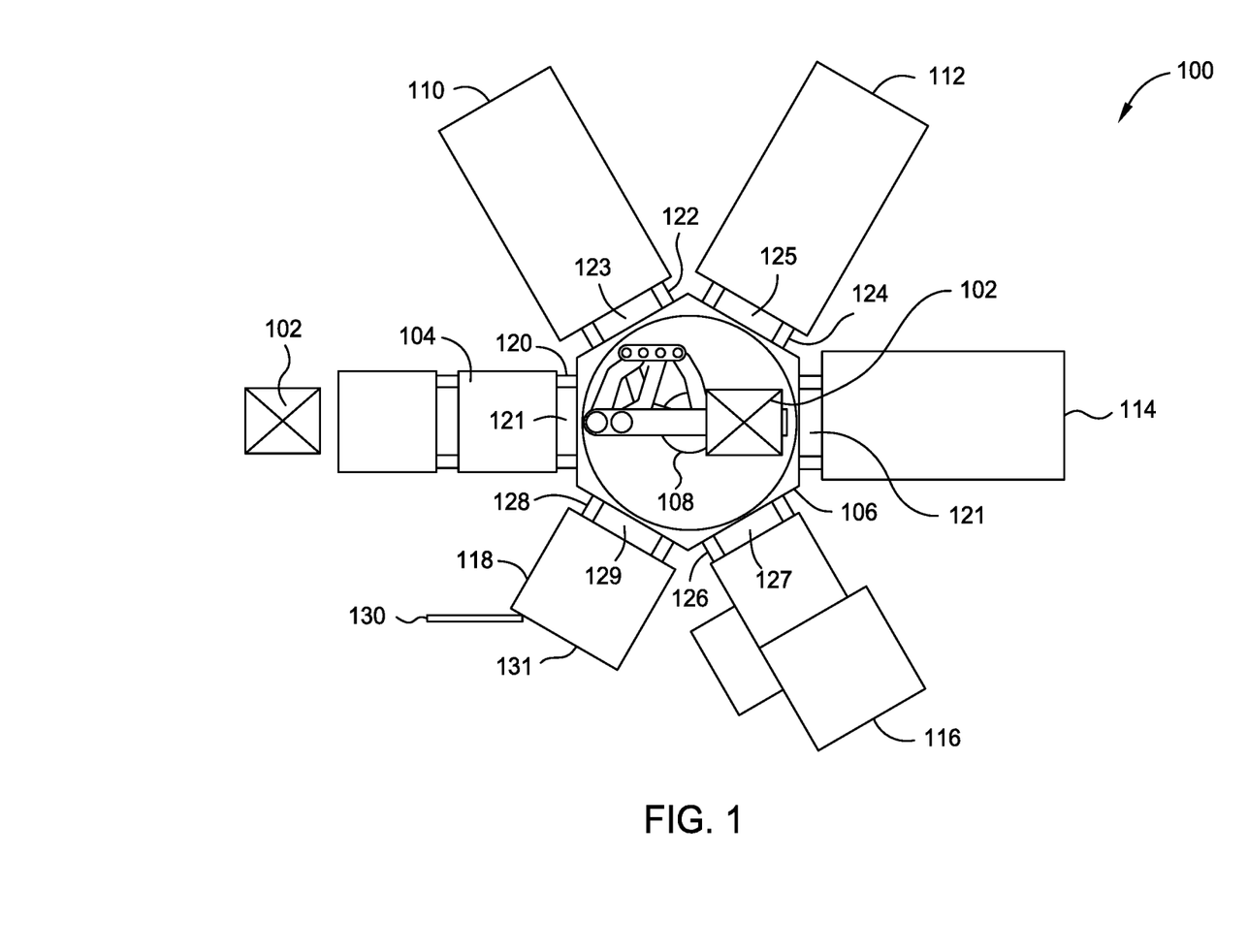
FIG. 1 illustrates an exemplary processing system, according to certain aspects of the present disclosure.

FIG. 1 is a cross sectional top view showing an illustrative processing system 100, according to one embodiment of the present disclosure. Exemplary substrates 102 are shown adjacent to and within the processing system 100. The processing system 100 includes a load lock chamber 104, a transfer chamber 106, a transfer (e.g., tool and material handling) robot 108 within the transfer chamber 106, a first CVD processing chamber 110, a second CVD processing chamber 112, a third CVD processing chamber 114, an ALD processing chamber 116, and a mask chamber 118. The first CVD processing chamber 110, second CVD processing chamber 112, ALD processing chamber 116, and each chamber's associated hardware are preferably formed from one or more process-compatible materials, such as aluminum, anodized aluminum, nickel plated aluminum, carbon steel, stainless steel, quartz, and combinations and alloys thereof, for example. The first CVD processing chamber 110, second CVD processing chamber 112, third CVD processing chamber 114 and ALD processing chamber 116 may be round, rectangular, or another shape, as required by the shape of the substrate to be coated and other processing requirements.

The transfer chamber 106 includes slit valve openings 121, 123, 125, 127, 129 in sidewalls adjacent to the load lock chamber 104, first CVD processing chamber 110, second CVD processing chamber 112, third CVD processing chamber 114, ALD processing chamber 116, and mask chamber 118. The transfer robot 108 is positioned and configured to be capable of inserting one or more tools (e.g., substrate handling blades) through each of the transfer port openings 121, 123, 125, 127, 129 and into the adjacent chamber. That is, the transfer robot can insert tools into the load lock chamber 104, the first CVD processing chamber 110, the second CVD processing chamber 112, the third CVD processing chamber 114, the ALD processing chamber 116, and the mask chamber 118 via transfer port openings 121, 123, 125, 127, 129 in the walls of the transfer chamber 106 adjacent to each of the other chambers. The transfer port openings 121, 123, 125, 127, 129 are selectively opened and closed with transfer port valves 120, 122, 124, 126, 128 to allow access to the interiors of the adjacent chambers when a substrate, mask, tool, or other item is to be inserted or removed from one of the adjacent chambers.

The transfer chamber 106, load lock chamber 104, first CVD processing chamber 110, second CVD processing chamber 112, ALD processing chamber 116, and mask chamber 118 include one or more apertures (not shown) that are in fluid communication with a vacuum system (e.g., a vacuum pump). The apertures provide an egress for the gases within the various chambers. In some embodiments, the chambers are each connected to a separate and independent vacuum system. In still other embodiments, some of the chambers share a vacuum system, while the other chambers have separate and independent vacuum systems. The vacuum systems can include vacuum pumps (not shown) and throttle valves (not shown) to regulate flows of gases through the various chambers.

Masks, mask sheets, and other items placed within the first CVD chamber 110, second CVD chamber 112, and ALD processing chamber 116, other than substrates, may be referred to as a "process kit." Process kit items may be removed from the processing chambers for cleaning or replacement. The transfer chamber 106, mask chamber 118, first CVD processing chamber 110, second CVD processing chamber 112, and ALD processing chamber 116 are sized and shaped to allow the transfer of masks, mask sheets, and other process kit items between them. That is, the transfer chamber 106, mask chamber 118, first CVD processing chamber 110, second CVD processing chamber 112, and ALD processing chamber 116 are sized and shaped such that any process kit item can be completely contained within any one of them with all of the transfer port openings 121, 123, 125, 127, 129 closed by each transfer port opening's 121, 123, 125, 127, 129 corresponding valve 120, 122, 124, 126, 128. Thus, process kit items may be removed and replaced without breaking vacuum of the processing system, as the mask chamber 118 acts as an airlock, allowing process kit items to be removed from the processing system without breaking vacuum in any of the chambers other than the mask chamber. Furthermore, the slit valve opening 129 between the transfer chamber 106 and the mask chamber 118, the slit valve openings 123, 125 between the transfer chamber 106 and the CVD processing chambers 110, 112, and the slit valve opening 127 between the transfer chamber 106 and the ALD processing chamber 116 are all sized and shaped to allow the transfer of process kit items between the transfer chamber 106 and the mask chamber 118, CVD processing chambers 110, 112, and ALD processing chamber 116.

The mask chamber 118 has a door 130 and doorway 131 on the side of the mask chamber 118 opposite the slit valve opening 129 of the transfer chamber 106. The doorway 131 is sized and shaped to allow the transfer of masks and other process tools into and out of the mask chamber 118. The door 130 is capable of forming an air-tight seal over the doorway 131 when closed. The mask chamber 118 is sized and shaped to allow any process kit item to be completely contained within the mask chamber 118 with both the door 130 closed and the slit valve 128 leading to the transfer chamber 106 closed. That is, the mask chamber 118 is sized and shaped such that any process kit item can be moved from the transfer chamber 106 into the mask chamber 118 and the slit valve 128 can be closed without the door 130 of the mask chamber 118 being opened.

For simplicity and ease of description, an exemplary coating process performed within the processing system 100 will now be described. The exemplary coating process is controlled by a process controller, which may be a computer or system of computers that may be located at the third CVD processing chamber 114.

Referring to FIG. 1, the exemplary processing of a substrate optionally begins with the transfer robot 108 retrieving a mask from the mask chamber 118 and placing the mask in the ALD processing chamber 116. Placing a mask in the ALD processing chamber 116 is optional because a mask may be left in the ALD processing chamber 116 from earlier processing, and the same mask may be used in processing multiple substrates. Similarly, the transfer robot 108 may optionally retrieve other masks from the mask chamber 118 and place the masks in the first and second CVD processing chambers 110 and 112. In placing masks within the first, second and third CVD processing chambers 110, 112, 114 and the ALD processing chamber 116, the appropriate slit valves 122, 124, 126, 128 between the chambers may be opened and closed.

Next, the transfer robot 108 retrieves a substrate from the load lock chamber 104 and places the substrate in the first CVD processing chamber 110. The process controller controls valves, actuators, and other components of the processing chamber to perform the CVD processing. The process controller causes the slit valve 122 to be closed, isolating the first CVD processing chamber 110 from the transfer chamber 106. The process controller also causes a substrate support member, or susceptor, to position the substrate for CVD processing. If the mask was not placed into the correct processing position by the transfer robot, then the process controller may activate one or more actuators to position the mask. Alternatively or additionally, the susceptor may also position the mask for processing. The mask is used to mask off certain areas of the substrate and prevent deposition from occurring on those areas of the substrate.

The process controller now activates valves to start the flow of precursor and other gases into the first CVD processing chamber 110. The precursor gases may include silane $SiH_4$, for example. The process controller controls heaters, plasma discharge components, and the flow of gases to cause the CVD process to occur and deposit layers of materials on the substrate. In one embodiment, the deposited layer may be silicon nitride SiN, although embodiments of the disclosure are not limited to this material. As noted above, embodiments of the disclosure may also be used to perform PECVD. The CVD process in the exemplary processing of the substrate is continued until the deposited layer reaches the required thickness. In one exemplary embodiment, the required thickness is 5,000 to 10,000 Angstroms (500 to 1,000 nm).

When the CVD process in the first CVD processing chamber 110 is complete, the process controller causes the first CVD processing chamber 110 vacuum level to match the vacuum level of the transfer chamber 106 and then controls the susceptor to lower the substrate to a transfer position. The process controller also causes the slit valve 122 between the first CVD processing chamber 110 and the transfer chamber 106 to be opened and then directs the transfer robot 108 to retrieve the substrate from the first CVD processing chamber 110. The process controller then causes the slit valve 122 between first CVD processing chamber 110 and the transfer chamber 106 to be closed.

Next, the process controller causes the slit valve 126 between the transfer chamber 106 and the ALD processing chamber 116 to be opened. The transfer robot 108 places the substrate in the ALD processing chamber 116, and the process controller causes the slit valve 126 between the transfer chamber 106 and the ALD processing chamber 116 to be closed. The process controller also causes a substrate support member, or susceptor, to position the substrate for ALD processing. If the mask was not placed into the correct processing position by the transfer robot, then the process controller may activate one or more actuators to position the mask. Alternatively or additionally, the susceptor may position the mask for processing. The mask is used to mask off certain areas of the substrate and prevent deposition from occurring on those areas of the substrate.

The process controller now activates valves to start the flow of precursor and other gases into the ALD processing chamber 116. The particular gas or gases that are used depend upon the process or processes to be performed. The gases can include trimethylaluminium $(CH_3)_3Al$ (TMA), nitrogen $N_2$, and oxygen $O_2$, however, the gases are not so limited and may include one or more precursors, reductants, catalysts, carriers, purge gases, cleaning gases, or any mixture or combination thereof. The gases may be introduced into the ALD processing chamber from one side and flow across the substrate. Depending on requirements of the processing system, the process controller may control valves such that only one gas is introduced into the ALD processing chamber at any particular instant of time. In other embodiments, a $ZrO_2$ film formation process may be performed in the ALD processing chamber 116 with a precursor such as TEMAZ (tetrakis ethyl methyl amino zirconium, $Zr[N(CH_3)(C_2H_5)]_4$).

The process controller also controls a power source capable of activating the gases into reactive species and maintaining the plasma of reactive species to cause the reactive species to react with and coat the substrate. For example, radio frequency (RF) or microwave (MW) based power discharge techniques may be used. The activation may also be generated by a thermally based technique, a gas breakdown technique, a high intensity light source (e.g., UV energy), or exposure to an x-ray source. In the exemplary process, oxygen is activated into a plasma, and the plasma reacts with and deposits a layer of oxygen on the substrate. The process controller then causes TMA to flow across the substrate, and the TMA reacts with the layer of oxygen on the substrate, forming a layer of aluminum oxide on the substrate. The process controller causes repetition of the steps of flowing oxygen, activating oxygen into a plasma, and flowing TMA to form additional layers on the substrate. The process controller continues repeating the described steps until the deposited layer of aluminum oxide is the required thickness. In one exemplary embodiment, the required thickness is 500 to 700 Angstroms (50 to 70 nm).

When the ALD process in the ALD processing chamber 116 is complete, the process controller causes the ALD processing chamber 116 to be evacuated and then controls the susceptor to lower the substrate to a transfer position. The process controller also causes the slit valve 126 between the ALD processing chamber 116 and the transfer chamber 106 to be opened and then directs the transfer robot 108 to retrieve the substrate from the ALD processing chamber 116. The process controller then causes the slit valve 126 between ALD processing chamber 116 and the transfer chamber 106 to be closed.

Still referring to FIG. 1, next, the process controller causes the slit valve 124 between the transfer chamber 106 and the second CVD processing chamber 112 to be opened. The transfer robot 108 places the substrate in the second CVD processing chamber 112, and the process controller causes the slit valve 124 between the transfer chamber 106 and the second CVD processing chamber 112 to be closed. Processing in the second CVD processing chamber 112 is similar to the processing in the first CVD processing chamber 110 described above. In the exemplary processing of the substrate, the CVD process performed in the second CVD processing chamber 112 is continued until the deposited layer reaches the desired thickness. In one exemplary embodiment, the desired thickness is 5,000 to 10,000 Angstroms (500 to 1,000 nm).

Thus, when the process in the second CVD processing chamber 112 is complete, the substrate will be coated with a first layer of SiN that is 5,000 to 10,000 Angstroms thick, a layer of $Al_2O_3$ that is 500 to 700 Angstroms thick, and a second layer of SiN that is 5,000 to 10,000 Angstroms thick. The layer of $Al_2O_3$ is believed to lower the water vapor transfer rate through the encapsulation layer, as compared to SiN alone, thus improving the reliability of the encapsulation, as compared to encapsulating with SiN alone.

In the exemplary process described above with reference to FIG. 1, each of the CVD processing chambers 110, 112 and the ALD processing chamber 116 is loaded with a mask. Alternatively, the processing system 100 may perform a process wherein a mask moves with a substrate from processing chamber to processing chamber. That is, in a second exemplary process, a substrate and mask are placed (simultaneously or individually) in the first CVD processing chamber 110, and the slit valve 122 between the transfer chamber 106 and the first processing chamber 110 is closed. A CVD process is then performed on the substrate. The substrate and mask are then moved (simultaneously or individually) into the ALD processing chamber 116, and the slit valve 126 between the transfer chamber and the ALD processing chamber 116 is closed. An ALD process is then performed on the substrate. The substrate and mask are then moved (simultaneously or individually) into the second CVD processing chamber 112. A CVD process is then performed on the substrate, and the substrate and mask are then removed from the second CVD processing chamber 112. The substrate may be removed from the processing system 100, if complete, and the mask may be used for processing a new substrate or removed from the processing system 100 for cleaning, for example.

Figure 2A:
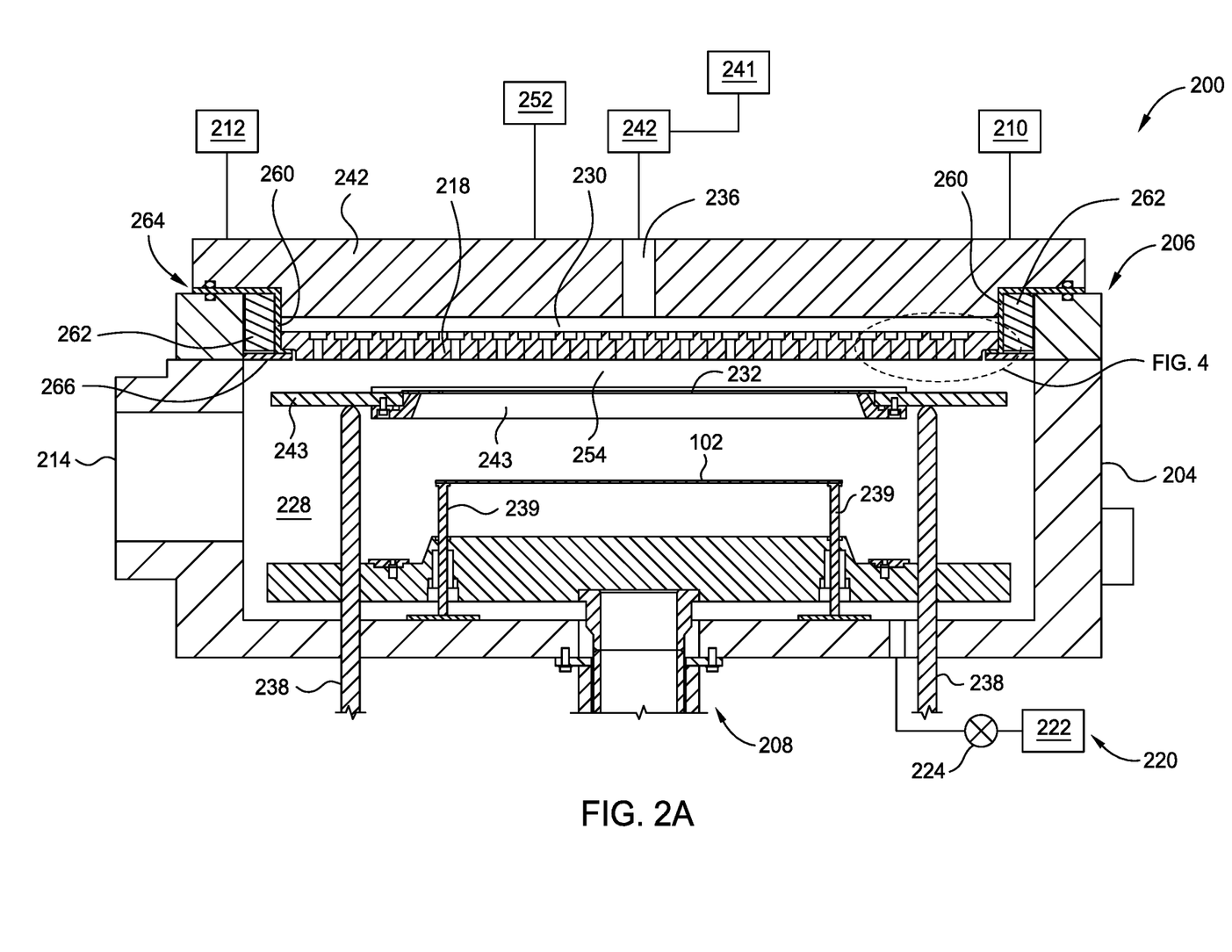
FIG. 2A is a sectional side view showing an illustrative ALD processing chamber according to embodiments described herein.
Figure 2B:
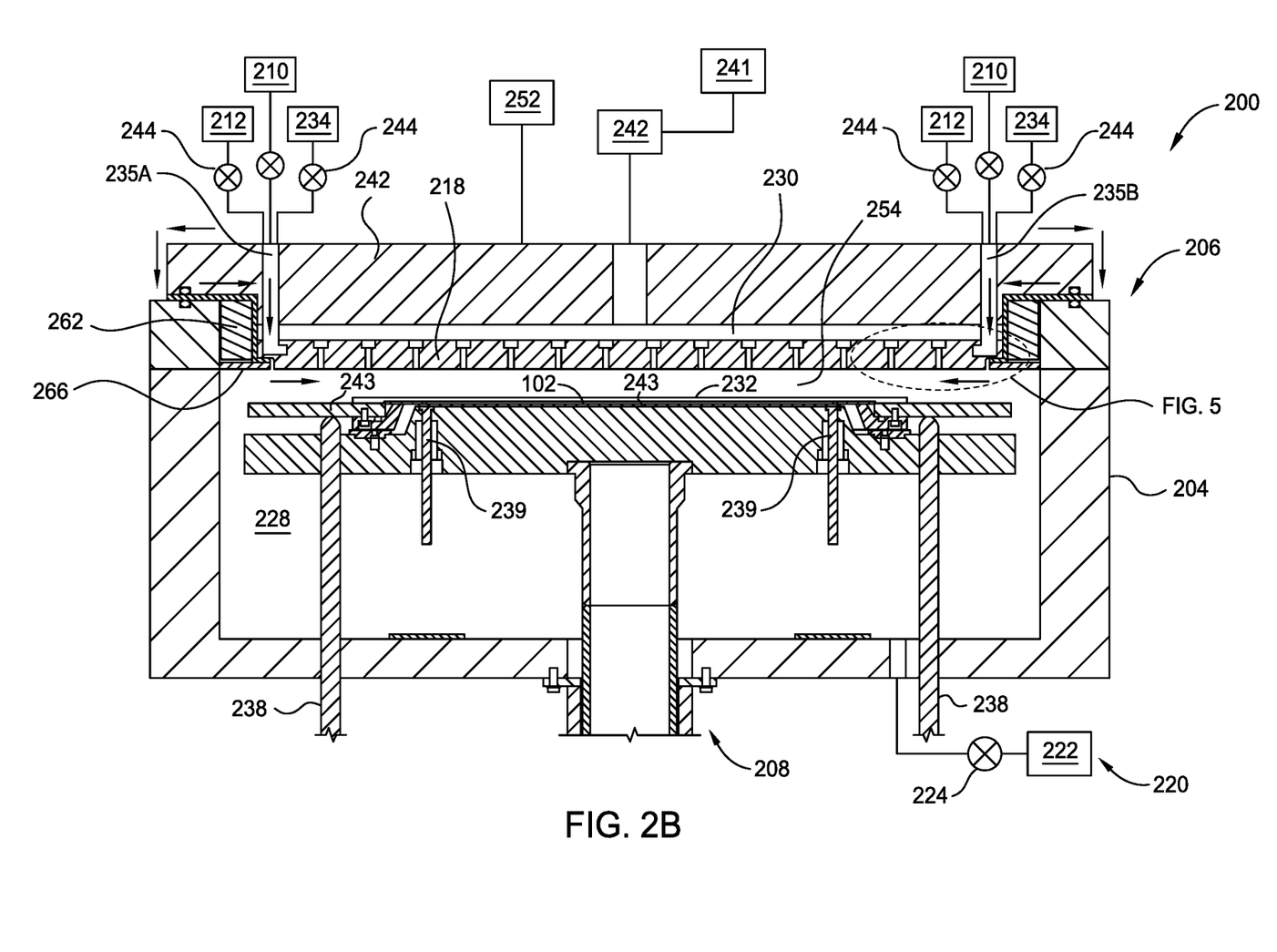
FIG. 2B is a sectional side view of the processing chamber that is rotated 90 degrees from the view shown in FIG. 2A.

FIG. 2A is a sectional side view showing an illustrative ALD processing chamber 200 according to embodiments described herein. FIG. 2B is a sectional side view of the processing chamber 200 that is rotated 90 degrees from the view shown in FIG. 2A. The ALD processing chamber 200 shown in FIGS. 2A and 2B is similar to the ALD processing chamber 116 shown in FIG. 1.

The processing chamber 200 includes a chamber body 204, a lid assembly 206, and a susceptor or substrate support assembly 208. The lid assembly 206 is disposed at an upper end of the chamber body 204, and the substrate support assembly 208 is at least partially disposed within the chamber body 204. The substrate support assembly 208 of the processing chamber 200 shown in FIG. 2A is in a transfer position while the substrate support assembly 208 of the processing chamber 200 shown in FIG. 2B is in a processing position.

The lid assembly 206 includes a first channel 235A and a second channel 235B (both are shown in FIG. 2B). Both of the first channel 235A and the second channel 235B are coupled to a gas source 210, a purge/carrier gas source 234 and a pump 212. The pump 212 is part of a vacuum system 220. Each of the gas source 210, the purge/carrier gas source 234 and the pump 212 are controlled by valves 244. The lid assembly 206 also includes a multi-channel showerhead 218 and a backing plate 242.

The vacuum system 220 includes the pumps 212 as well as a pump 222. The pump 222 is coupled to a valve 224. The vacuum system 220 is controlled by a process controller to maintain a pressure within the ALD processing chamber suitable for the ALD process. The vacuum system 220 may be used to maintain a first pressure in an interior volume 228 of the processing chamber 200. The vacuum system 220 may also be used to maintain a second pressure within a volume 230 defined between the multi-channel showerhead 218 and the backing plate 242. In one embodiment of the present disclosure, the first pressure may be less than the second pressure.

The lid assembly 206 also includes a hanger assembly 260 (best shown in FIG. 2A) that suspends the multi-channel showerhead 218 in the processing chamber 200. The hanger assembly 260 substantially surrounds a dielectric skirt 262. The dielectric skirt 262 is made from a polymer material, such as a fluoropolymer, that electrically insulates portions of the lid assembly 206 from the chamber body 204. Seals 264, such as O-ring seals, are provided at the interface of the backing plate 242 and the chamber body 204. A portion of the dielectric skirt 262 is positioned between the seals 264. A ceramic cover 266 is positioned to extend inward to at least partially cover the multi-channel showerhead 218.

The chamber body 204 includes a slit valve opening 214 formed in a sidewall thereof to provide access to the interior of the processing chamber 200. As described above with reference to FIG. 1, the slit valve opening 214 is selectively opened and closed to allow access to the interior of the chamber body 204 by a transfer robot (see FIG. 1). The lid assembly 206 also includes a central channel 236 within the backing plate 242. The central channel 236 is utilized to deliver a cleaning gas and/or a purge/carrier gas from a gas source 241. In some embodiments, the cleaning gas is flowed through a remote plasma source 242 that energizes the cleaning gas prior to entry into the volume 230. The lid assembly 206 also includes a radio frequency (RF) power source 252 that forms a RF path (shown by arrows in FIG.

2B) to energize precursor gases in a processing volume 254 between the substrate 102 and the multi-channel showerhead 218. In other embodiments, the gas source 241 includes oxygen that is flowed directly to the processing volume 254 via the multi-channel showerhead 218. The oxygen from the gas source 241 may be flowed to the processing volume 254 continuously (during processing) in one embodiment. The gas in the gas source 241 may be referred to as a first gas or a continuous gas. The gas source 210 (discussed above) may be referred to as a second gas or a pulsed gas.

Precursor gases (e.g., a second gas or a pulsed gas) as well as purge/carrier gases flow through the multi-channel showerhead 218 from the first channel 235A and the second channel 235B alternatively to provide a bi-directional flow path across a mask sheet 243. The bi-directional flow path will be described in detail below.

Above the substrate support assembly 208, a mask frame 243 is supported by support members 238. The support members 238 may also serve as alignment and/or positioning devices for the mask frame 243. A substrate 102 is shown supported by lift pins 239 movably disposed in the substrate support assembly 208. The substrate 102 is shown in a transfer position in FIG. 2A such that a robot handling blade (not shown) may access a surface of the substrate 102 opposing the substrate support assembly 208. In a processing position shown in FIG. 2B, the substrate 102 may be raised by the substrate support assembly 208 to a position adjacent to the mask frame 243. Specifically, the substrate 102 is adapted to be in contact with, or in proximity to, the mask sheet 232 coupled to the mask frame 243.

Figure 3:
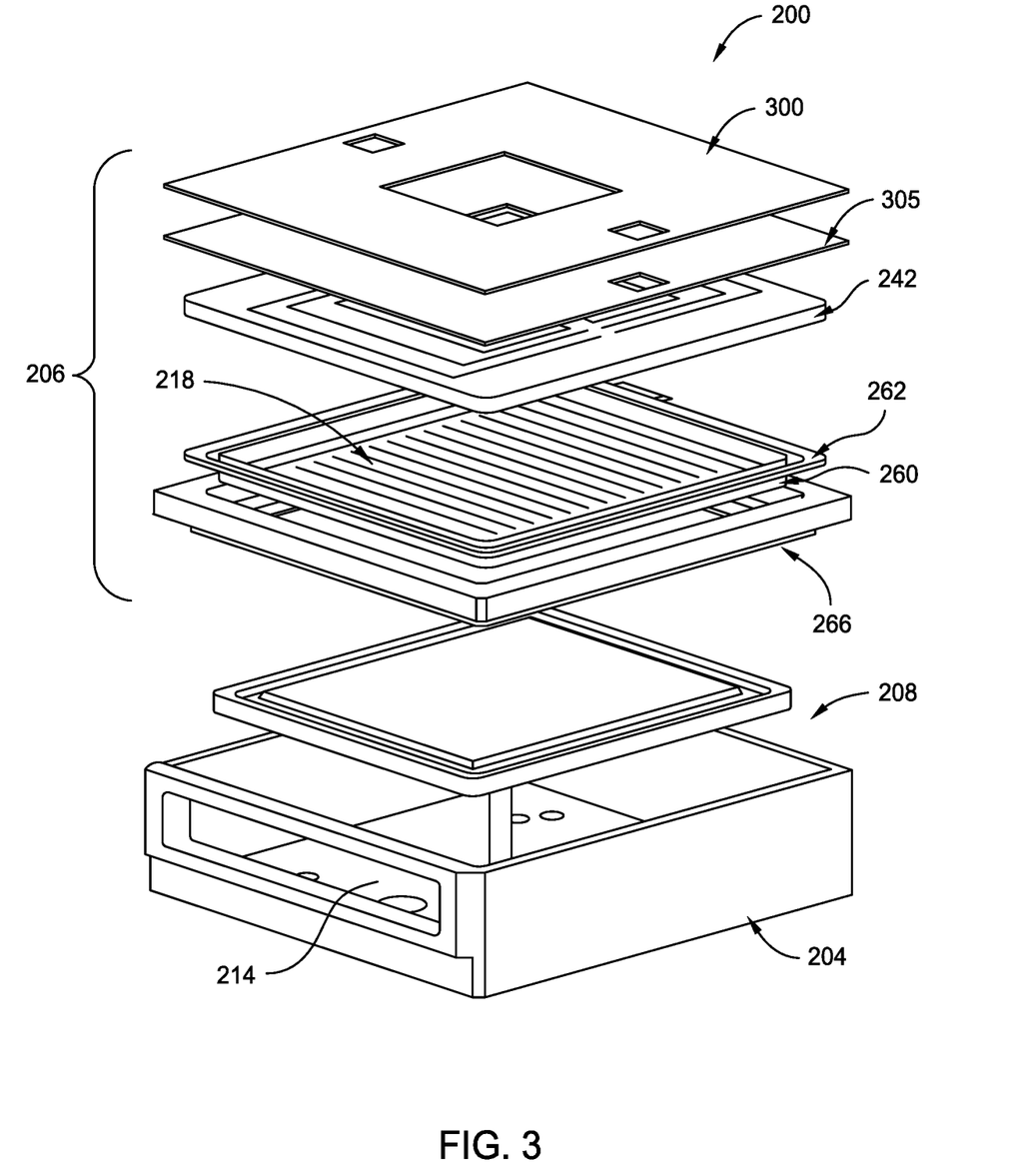
FIG. 3 is an exploded view of the processing chamber of FIGS. 2A and 2B.

FIG. 3 is an exploded view of the processing chamber 200 of FIGS. 2A and 2B. In addition to the backing plate 242, the multi-channel showerhead 218, and the dielectric skirt 262, the lid assembly 206 includes a cooling plate 300 and a RF heat shield 305 positioned on top of the backing plate 242. Both of the cooling plate 300 and the RF heat shield 305 may be made of aluminum. The cooling plate 300 includes coolant channels (not shown) where a cooling fluid may be flowed.

Figure 4:
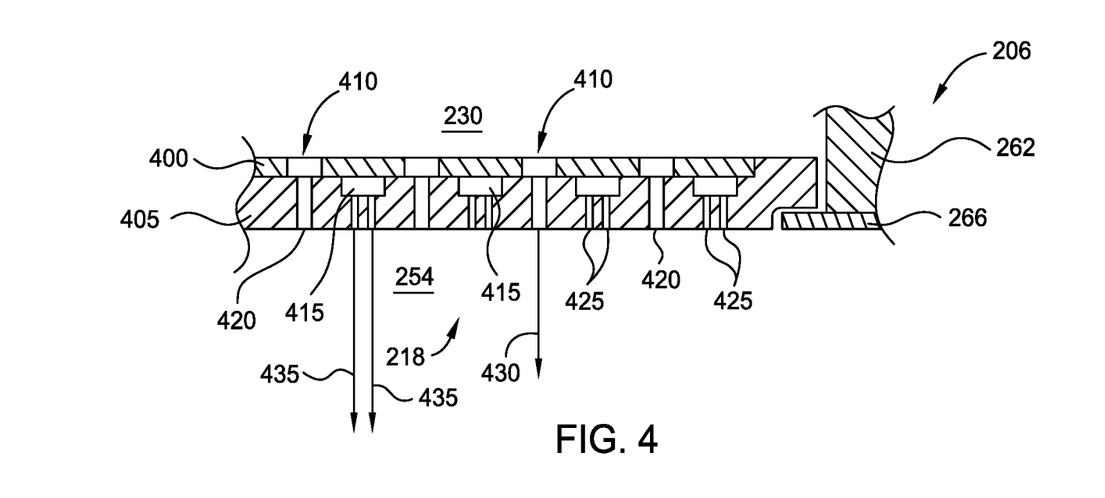
FIGS. 4 and 5 are enlarged sectional views of portions of the lid assembly of FIGS. 2A and 2B, respectively.
Figure 5:
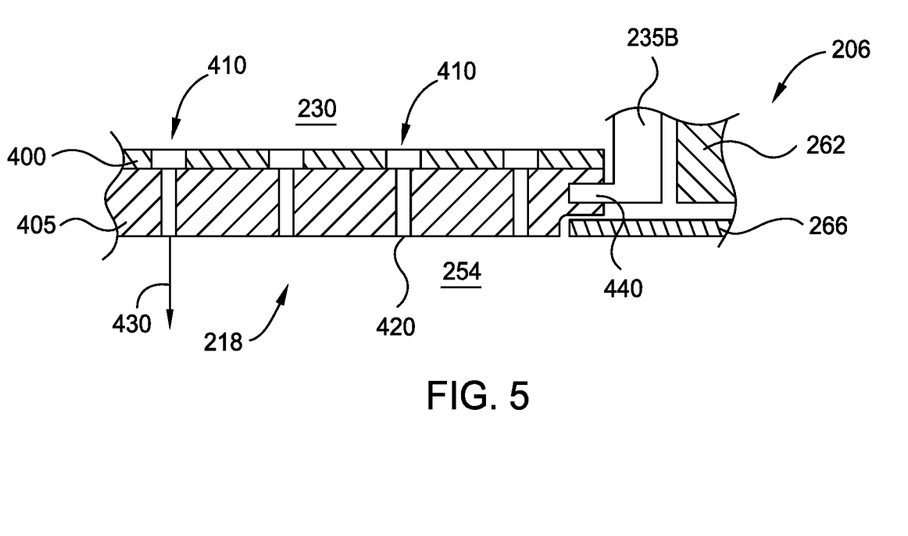

FIGS. 4 and 5 are enlarged sectional views of portions of the lid assembly 206 of FIGS. 2A and 2B, respectively. The multi-channel showerhead 218 includes a plurality of plates shown as a first plate 400 and a second plate 405. The first plate 400 includes a plurality of first gas channels 410. The second plate 405 includes a plurality of second gas channels 415 (shown in FIG. 4). The second plate 405 also includes a plurality of first orifices 420 formed through the second plate 405 that are in fluid communication and concentric with a respective one of the first gas channels 410 in the first plate 400. The second plate 405 also includes a plurality of second orifices 425 formed therethrough that are in fluid communication with a respective one of the second gas channels 415. At least a portion of the plurality of second gas channels 415 is bounded by the first plate 400.

Each of the plurality of first gas channels 410 cooperate with each of the plurality of first orifices 420 to deliver a first gas 430 from the gas source 241 (shown in FIGS. 2A and 2B) from the volume 230 to the processing volume 254. Likewise, each of the second gas channels 415 cooperate with respective second orifices 425 to deliver a second gas 435 from the gas sources 210 from the second channel 235B. While not shown, each of the second gas channels 415 and the second orifices 425 are fluidly coupled to the first channel 235A.

The first gas 430 may be continuously flowed during processing. However, the second gas 435 is pulsed in intervals alternatively from the second channel 235B and the first channel 235A. Each of the second channel 235B and the first channel 235A are coupled to a flow guide 440.

Figure 6A:
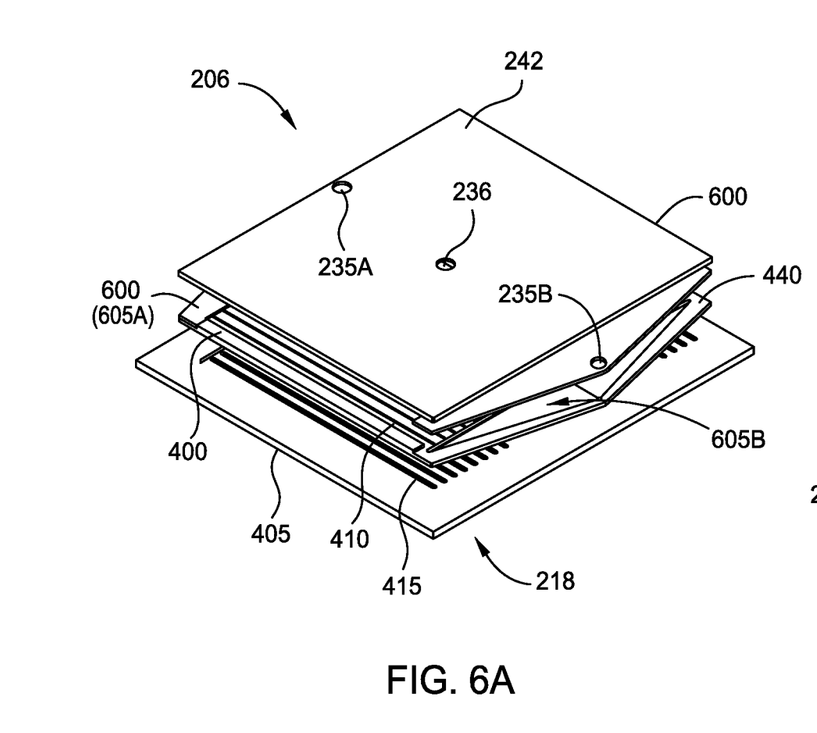
FIG. 6A is an isometric top view of a portion of the lid assembly.
Figure 6B:
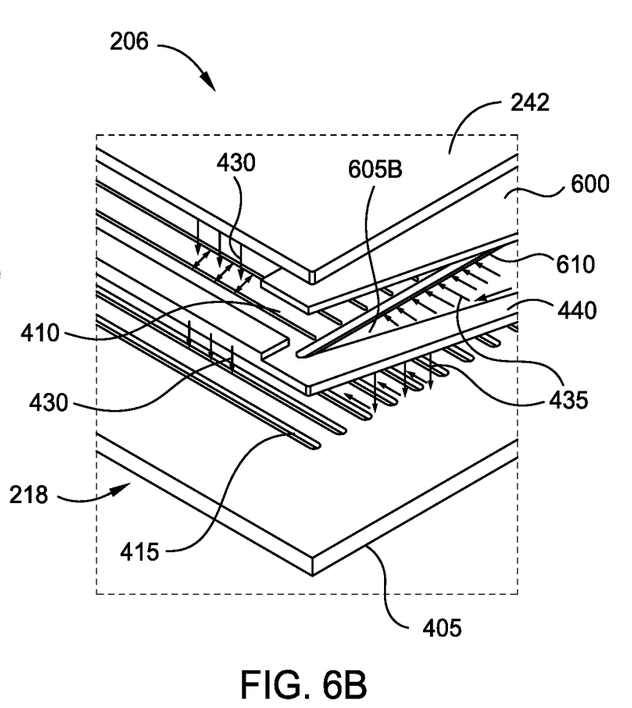
FIG. 6B is an enlarged view of a portion of the lid assembly shown in FIG. 6A.

FIG. 6A is an isometric top view of a portion of the lid assembly 206. FIG. 6B is an enlarged view of a portion of the lid assembly 206 shown in FIG. 6A.

The flow guide 440 is shown in FIGS. 6A and 6B. The flow guide 440 is positioned between the backing plate 242 and the multi-channel showerhead 218. The flow guide 440 includes a cover 600 on both sides thereof. The covers 600 enclose a manifold 605A and 605B (only manifold 605A is shown on the right hand side of FIG. 6A). Each manifold 605A, 605B is in fluid communication with the first channel 235A and the second channel 235B, respectively. Each of the first channel 235A and the second channel 235B are in selective fluid communication with the gas source 241, the pump 212 and the purge/carrier gas source 234 (shown in FIGS. 2A and 2B). The manifolds 605A, 605B are in fluid communication with the multi-channel showerhead 218 via a slot 610 formed in a body of the respective manifolds 605A, 605B.

As shown in FIG. 6B, the flow paths of the second gas 435 are shown by arrows. Likewise, the flow paths of the first gas 430 are shown by arrows in FIG. 6B. The first gas 430 flows from the gas source 241 (shown in FIGS. 2A and 2B) through the central channel 236 and to the first gas channels 410 formed in the multi-channel showerhead 218. During processing, the flow of the first gas 430 may be continuous as discussed above.

Figure 6C:
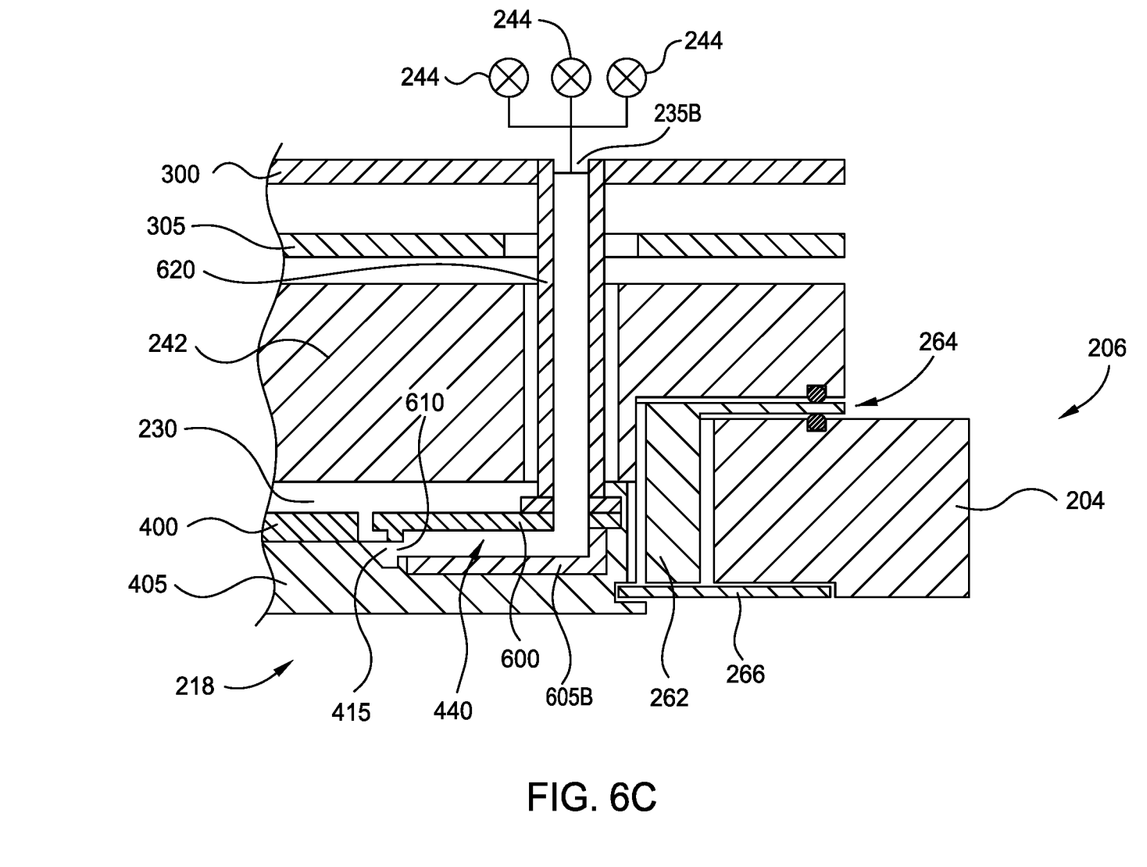
FIG. 6C is a partial sectional view of the lid assembly.

FIG. 6C is a partial sectional view of the lid assembly 206. The second gas 435 is alternately provided to the multi-channel showerhead 218 from the gas source 241 (shown in FIGS. 2A and 2B) via the second channel 235B, the manifold 605B, the slot 610 and to the second gas channels 415. While not shown, the manifold 605A is constructed similarly and is fluidly coupled to the gas source 241, the pump 212 and the purge/carrier gas source 234 (shown in FIGS. 2A and 2B).

When the second gas 435 and/or a purge/carrier gas from the purge/carrier gas source 234 is provided to the multi-channel showerhead 218 by the second channel 235B and the manifold 605B, the manifold 605A and the first channel 235A are fluidly coupled to the pump 212. The pump 212 evacuates any precursor gases from the second gas 435 that do not react as well as purge/carrier gases. Then, the second gas 435 and/or a purge/carrier gas from the purge/carrier gas source 234 is provided to the multi-channel showerhead 218 by the first channel 235A and the manifold 605A. During this time, the manifold 605B and the second channel 235B are fluidly coupled to the pump 212. The pump 212 evacuates any precursor gases from the second gas 435 that do not react as well as purge/carrier gases. The bi-directional flow of the second gas 435 and/or the purge/carrier gas from either of the manifold 605A and the manifold 605B may be repeated for multiple cycles.

As shown in FIG. 6C, the second channel 235B includes a tube 620 that is positioned between the cooling plate 300 and the flow guide 440. The tube 620 is made of a dielectric material, such as a polymer or a ceramic material. The flow guide 440 (e.g., the first plate 400) as well as the second plate 405 may be made from an aluminum material. The first plate 400 and the second plate 405 are coupled to each other by a brazing process, for example.

In one embodiment of an ALD process sequence, a first cycle of a precursor is flowed in a first direction and provided to the chamber (e.g., via the multi-channel showerhead 218) for a first time period. The first cycle is followed by a second cycle of a precursor is flowed in a second direction (opposite to the first direction) and provided to the chamber (e.g., via the multi-channel showerhead 218) for a second time period.

The first cycle and the second cycle include a precursor injection period, which may be a pulse of a precursor gas flowed to in the first direction or the second direction, respectively. The precursor is provided from the gas source 210 (shown in FIGS. 2A and 2B). The precursor includes a silicon containing gas, such as a silane, for example diisopropylaminosilane (DIPAS). The first cycle and the second cycle include periods of a first purge/carrier gas period and second purge/carrier gas period, and a plasma period is provided therebetween. The purge/carrier gases are provided from the purge/carrier gas source 234 (shown in FIGS. 2A and 2B). During both of the first cycle and the second cycle, a gas from the gas source 241 (shown in FIGS. 2A and 2B) is flowed continuously.

Figure 7A:
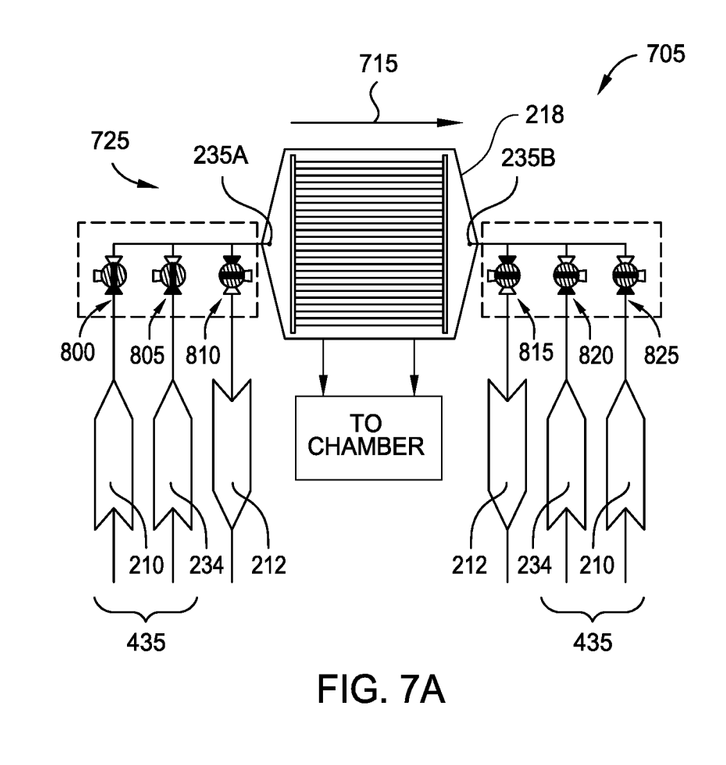
FIGS. 7A and 7B are schematic diagrams of embodiments of pulses of the second gas during cycles in the first direction and the second direction, respectively.
Figure 7B:
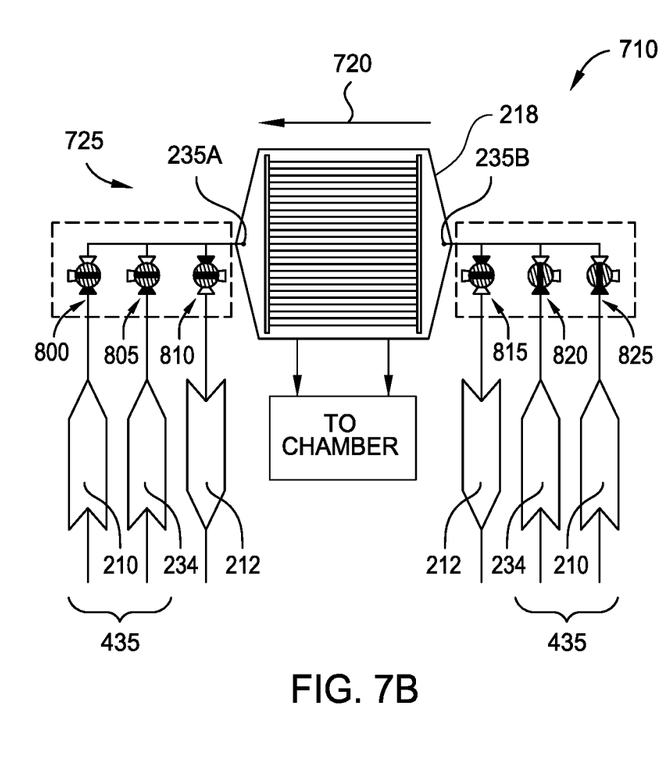
Figure 8A:
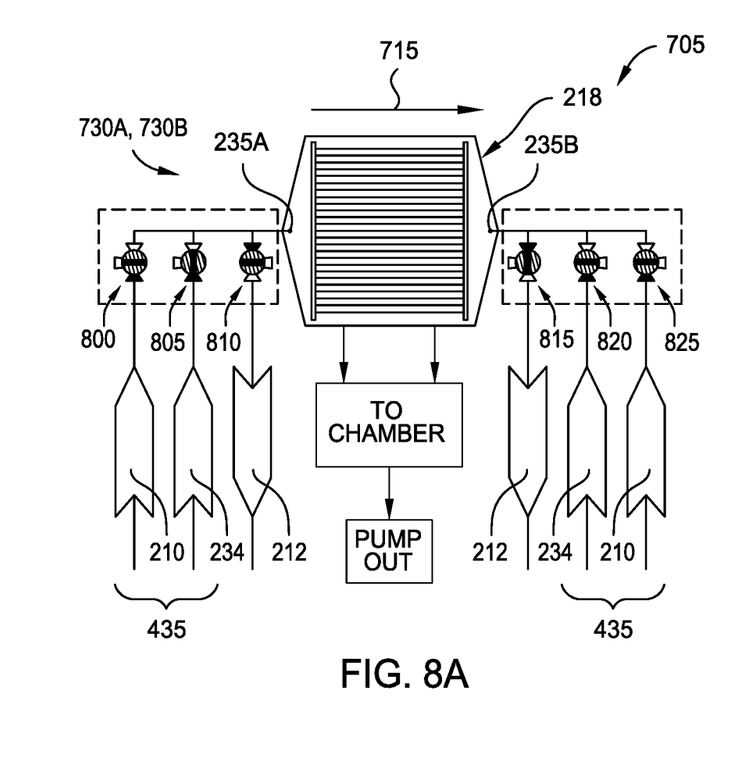
FIGS. 8A and 8B are schematic diagrams showing flow of the purge/carrier gas source during the first cycle and the second cycle, respectively.
Figure 8B:
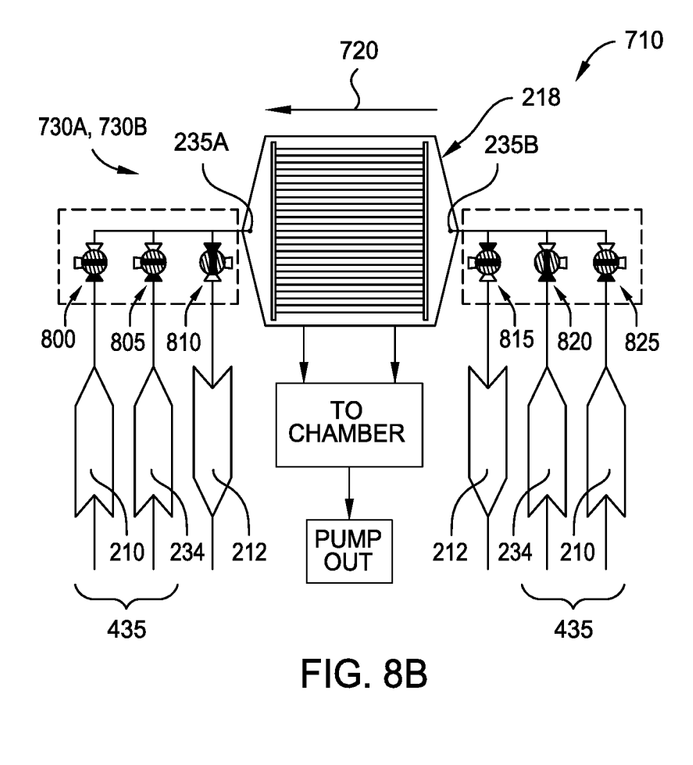

FIGS. 7A and 7B are schematic diagrams of embodiments of pulses of the second gas 435 during cycles in a first direction 715 and a second direction 720, respectively. FIGS. 8A and 8B are schematic diagrams showing flow of the purge/carrier gas source during a first cycle 705 and a second cycle 710, respectively. Valves shown in FIGS. 7A-8B are similar to the valves 244 shown in FIG. 2B. Valves coupled to the first channel 235A include a valve 800 controlling flow of the gas source 210, a valve 805 controlling flow of the purge/carrier gas source 234, and a valve 810 controlling the pump 212. Valves coupled to the second channel 235B include a valve 815 controlling the pump 212, a valve 820 controlling flow of the purge/carrier gas source 234, and a valve 825 controlling the flow of the gas source 210.

In FIG. 7A, flow of the second gas 435 is shown in the first direction 715. The valve 800 and the valve 805 are open to flow the second gas 435. The valve 810, which controls the pump 212, is closed. As the second gas 435 flows from the first channel 235A to the second channel 235B, the valve 815 is open to allow the pump 212 to exhaust excess gases while the valve 820 and the valve 825 are closed.

In FIG. 7B, flow of the second gas 435 is shown in the second direction 720. The valve 820 and the valve 825 are open to flow the second gas 435. The valve 815, which controls the pump 212, is closed. As the second gas 435 flows from the second channel 235B to the first channel 235A, the valve 810 is open to allow the pump 212 to exhaust excess gases while the valve 800 and the valve 805 are closed.

In FIG. 8A, flow of the purge/carrier gas is shown in the first direction 715. The valve 805 is open to provide flow of the gas from the purge/carrier gas source 234. The valve 800 and the valve 810, which controls the pump 212, are closed. As the purge/carrier gas flows from the first channel 235A to the second channel 235B, the valve 815 is open to allow the pump 212 to exhaust excess gases while the valve 820 and the valve 825 are closed.

In FIG. 8B, flow of the purge/carrier gas is shown in the second direction 720. The valve 820 is open to provide flow of the gas from the purge/carrier gas source 234. The valve 800 and the valve 805 are closed. As the purge/carrier gas flows from the second channel 235B to the first channel 235A, the valve 815 is closed and the valve 810 is open to allow the pump 212 to exhaust excess gases. The valve 825 is closed.

Embodiments of the disclosure include a method and apparatus for an ALD chamber capable of bi-directional flow of precursor gases. The method and apparatus improves film uniformity by a factor of greater than 3 on a large area substrate. For example, the method and apparatus as described herein provides a film uniformity across a large area substrate of less than 1.5%, while conventional ALD processes have a uniformity of about 5% across the same substrate size.

While the foregoing is directed to embodiments of the present disclosure, other and further embodiments of the disclosure may be devised without departing from the basic scope thereof, and the scope thereof is determined by the claims that follow.

The invention claimed is:

1. A lid assembly for use in an atomic layer deposition (ALD) chamber, the lid assembly comprising:
a multi-channel showerhead having a first side and an opposing second side parallel to the first side, the multi-channel showerhead having a plurality of first gas channels and a plurality of second gas channels that are fluidly isolated from each of the first gas channels, wherein each of the first gas channels has a plurality of first orifices extending from the first gas channel to a face of the multi-channel showerhead and each of the second gas channels has a plurality of second orifices extending from the second gas channel to the face of the multi-channel showerhead; and
a flow guide having a first manifold positioned at the first side and a second manifold positioned at the second side, each of the manifolds being fluidly coupled to the plurality of second gas channels that extend linearly between the first manifold and the second manifold, wherein the first manifold is oriented to direct a gas in a first direction through the plurality of second gas channels and the second manifold is oriented to direct a gas in a second direction through the plurality of second gas channels across the multi-channel showerhead, the second direction being opposite to the first direction.

2. The lid assembly of claim 1, wherein the multi-channel showerhead includes a first plate and a second plate.

3. The lid assembly of claim 2, wherein each of the plurality of first gas channels is formed through the first plate.

4. The lid assembly of claim 3, wherein each of the plurality of first gas channels is formed through the first plate and the plurality of first orifices are formed through the second plate.

5. The lid assembly of claim 2, wherein each of the plurality of second gas channels is formed in the second plate.

6. The lid assembly of claim 2, wherein at least a portion of the plurality of second gas channels is bounded by the first plate.

7. The lid assembly of claim 1, wherein each of the flow guides includes a manifold.

8. The lid assembly of claim 7, wherein each manifold is fluidly coupled to each of the plurality of second gas channels by a slot formed therein.

9. A lid assembly for use in an atomic layer deposition (ALD) chamber, the lid assembly comprising:
a multi-channel showerhead having a first side and an opposing second side parallel to the first side, wherein the multi-channel showerhead includes a plurality of first gas channels and a plurality of second gas channels that are fluidly isolated from each of the first gas channels, and wherein each of the first gas channels has a plurality of first orifices extending from the first gas channel to a face of the multi-channel showerhead and each of the second gas channels has a plurality of second orifices extending from the second gas channel to the face of the multi-channel showerhead;

a dielectric skirt surrounding the multi-channel showerhead; and a flow guide having a first manifold positioned at the first side and a second manifold positioned at the second side, wherein each of the manifolds are fluidly coupled to the plurality of second gas channels that extend linearly between the first manifold and the second manifold, and wherein the first manifold is oriented to direct a gas in a first direction through the plurality of second gas channels and the second manifold is oriented to direct a gas in a second direction through the plurality of second gas channels across the multi-channel showerhead, the second direction being opposite to the first direction.

10. The lid assembly of claim 9, wherein each manifold is fluidly coupled to each of the plurality of second gas channels by a slot formed therein.

11. The lid assembly of claim 9, wherein the multi-channel showerhead includes a first plate and a second plate.

12. The lid assembly of claim 11, wherein at least a portion of the plurality of second gas channels is bounded by the first plate.

13. The lid assembly of claim 11, wherein each of the plurality of first gas channels is formed through the first plate.

14. The lid assembly of claim 13, wherein each of the plurality of first gas channels is formed through the first plate and the plurality of first orifices are formed through the second plate.

15. The lid assembly of claim 11, wherein each of the plurality of second gas channels is formed in the second plate.

16. A lid assembly for use in an atomic layer deposition (ALD) chamber, the lid assembly comprising:

a multi-channel showerhead having a first side and an opposing second side parallel to the first side, wherein the multi-channel showerhead includes a plurality of first gas channels and a plurality of second gas channels that are fluidly isolated from each of the first gas channels, and wherein each of the first gas channels has a plurality of first orifices extending from the first gas channel to a face of the multi-channel showerhead and each of the second gas channels has a plurality of second orifices extending from the second gas channel to the face of the multi-channel showerhead;

a dielectric skirt surrounding the multi-channel showerhead; and a flow guide having a first manifold positioned at the first side and a second manifold positioned at the second side, each of the manifolds being fluidly coupled to the plurality of second gas channels that extend linearly between the first manifold and the second manifold, wherein the first manifold is oriented to direct a gas in a first direction through the plurality of second gas channels and the second manifold is oriented to direct a gas in a second direction through the plurality of second gas channels across the multi-channel showerhead, the second direction being opposite to the first direction.

17. The lid assembly of claim 16, wherein the multi-channel showerhead includes a first plate having the plurality of first orifices spaced in a single row and a second plate having the plurality of second orifices spaced in a double row.

18. The lid assembly of claim 17, wherein each of the plurality of first gas channels is formed through the first plate.

19. The lid assembly of claim 17, wherein each of the plurality of second gas channels is formed in the second plate.

* * * * *